(12) United States Patent
Lee et al.

(10) Patent No.: US 12,119,363 B2
(45) Date of Patent: Oct. 15, 2024

(54) SENSOR PACKAGE STRUCTURE

(71) Applicant: KINGPAK TECHNOLOGY INC., Hsin-Chu County (TW)

(72) Inventors: Chien-Chen Lee, Hsin-Chu County (TW); Li-Chun Hung, Hsin-Chu County (TW); Ya-Han Chang, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 415 days.

(21) Appl. No.: 17/749,077

(22) Filed: May 19, 2022

(65) Prior Publication Data
US 2023/0238411 A1    Jul. 27, 2023

(30) Foreign Application Priority Data
Jan. 25, 2022   (TW) .................. 111103051

(51) Int. Cl.
*H01L 27/146*   (2006.01)
*H01L 23/00*   (2006.01)

(52) U.S. Cl.
CPC .. *H01L 27/14625* (2013.01); *H01L 27/14618* (2013.01); *H01L 24/05* (2013.01); *H01L 24/06* (2013.01); *H01L 24/32* (2013.01); *H01L 24/48* (2013.01); *H01L 24/49* (2013.01); *H01L 24/73* (2013.01); *H01L 2224/05553* (2013.01); *H01L 2224/05573* (2013.01); *H01L 2224/06135* (2013.01); *H01L 2224/32225* (2013.01); *H01L 2224/48106* (2013.01); *H01L 2224/48228* (2013.01); *H01L 2224/49175* (2013.01); *H01L 2224/73265* (2013.01)

(58) Field of Classification Search
CPC ......... H01L 27/14625; H01L 27/14618; H01L 24/05; H01L 24/06; H01L 24/32; H01L 24/48; H01L 24/49; H01L 24/73
See application file for complete search history.

(56) References Cited

U.S. PATENT DOCUMENTS 9,608,029 B2   3/2017   Wong
11,177,301 B2   11/2021   Tan et al.
(Continued)

FOREIGN PATENT DOCUMENTS

WO   WO2022024972 A1   2/2022

*Primary Examiner* — Marc Anthony Armand
(74) *Attorney, Agent, or Firm* — Li & Cai Intellectual Property Office

(57) ABSTRACT

A sensor package structure is provided and includes a substrate, a sensor chip, a ring-shaped supporting layer, and a light-permeable sheet. The sensor chip is disposed on and electrically coupled to the substrate. The ring-shaped supporting layer is disposed on the sensor chip and surrounds a sensing region of the sensor chip. The light-permeable sheet has a ring-shaped notch recessed in a peripheral edge of an inner surface of the light-permeable sheet, and a depth of the ring-shaped notch with respect to the inner surface is at least 10 μm. The light-permeable sheet is disposed on the ring-shaped supporting layer through the ring-shaped notch, and the inner surface is not in contact with the ring-shaped supporting layer, so that the inner surface of the light-permeable sheet, an inner side of the ring-shaped supporting layer, and the top surface of the sensor chip jointly define an enclosed space.

10 Claims, 7 Drawing Sheets

(56) References Cited

U.S. PATENT DOCUMENTS

| | | |
|---|---|---|
| 11,393,859 B2 | 7/2022 | Jo et al. |
| 2020/0373341 A1* | 11/2020 | Jo .......................... H01L 24/06 |
| 2022/0115426 A1* | 4/2022 | Son ....................... H04N 23/54 |

* cited by examiner

SENSOR PACKAGE STRUCTURE

CROSS-REFERENCE TO RELATED PATENT APPLICATION

This application claims the benefit of priority to Taiwan Patent Application No. 111103051, filed on Jan. 25, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure.

BACKGROUND OF THE DISCLOSURE

A conventional sensor package structure includes a glass sheet, a sensor chip, and an adhesive layer that is adhered between the glass sheet and the sensor chip. Since any structural change of the sensor chip can easily affect its sensing result, improvements on the conventional sensor package structure focus on changes to the adhesive layer for increasing the connection effect between the adhesive layer and other components. However, such improvements of the adhesive layer have material limitations.

SUMMARY OF THE DISCLOSURE

In response to the above-referenced technical inadequacies, the present disclosure provides a sensor package structure to effectively improve on the issues associated with conventional sensor package structures.

In one aspect, the present disclosure provides a sensor package structure, which includes a substrate, a sensor chip, a ring-shaped supporting layer, and a light-permeable sheet. The substrate has a first surface and a second surface that is opposite to the first surface. The sensor chip is disposed on the first surface of the substrate and is electrically coupled to the substrate, and a top surface of the sensor chip has a sensing region and a carrying region that is arranged outside of the sensing region. The ring-shaped supporting layer is disposed on the carrying region of the sensor chip and surrounds the sensing region. The light-permeable sheet has an outer surface and an inner surface that is opposite to the outer surface. The light-permeable sheet has a ring-shaped notch recessed in a peripheral edge of the inner surface, and a depth of the ring-shaped notch with respect to the inner surface is at least 10 µm. The light-permeable sheet is disposed on the ring-shaped supporting layer through the ring-shaped notch, and the inner surface of the light-permeable sheet is not in contact with the ring-shaped supporting layer, so that the inner surface of the light-permeable sheet, an inner side of the ring-shaped supporting layer, and the top surface of the sensor chip jointly define an enclosed space therein.

Therefore, the light-permeable sheet of the sensor package structure provided by the present disclosure is limited to being disposed on the ring-shaped supporting layer only through the ring-shaped notch, thereby effectively reducing occurrence of delamination between the light-permeable sheet and the ring-shaped supporting layer, and further reducing the occurrences of any process defects during the manufacturing of the sensor package structure (such as a bleeding phenomenon during solidification of the ring-shaped supporting layer, or tilting or squashing of the light-permeable sheet).

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
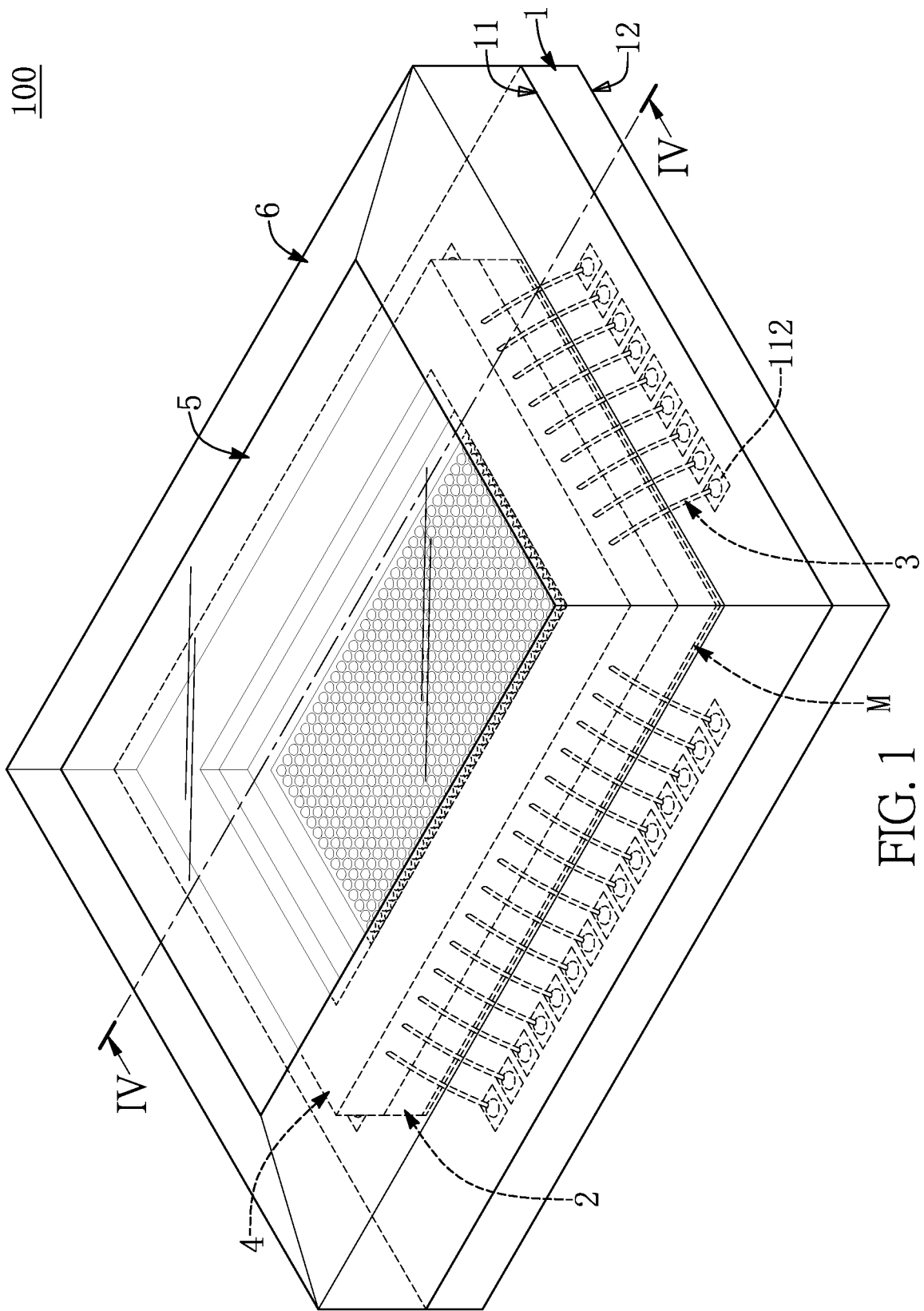
FIG. 1 is a perspective view of a sensor package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
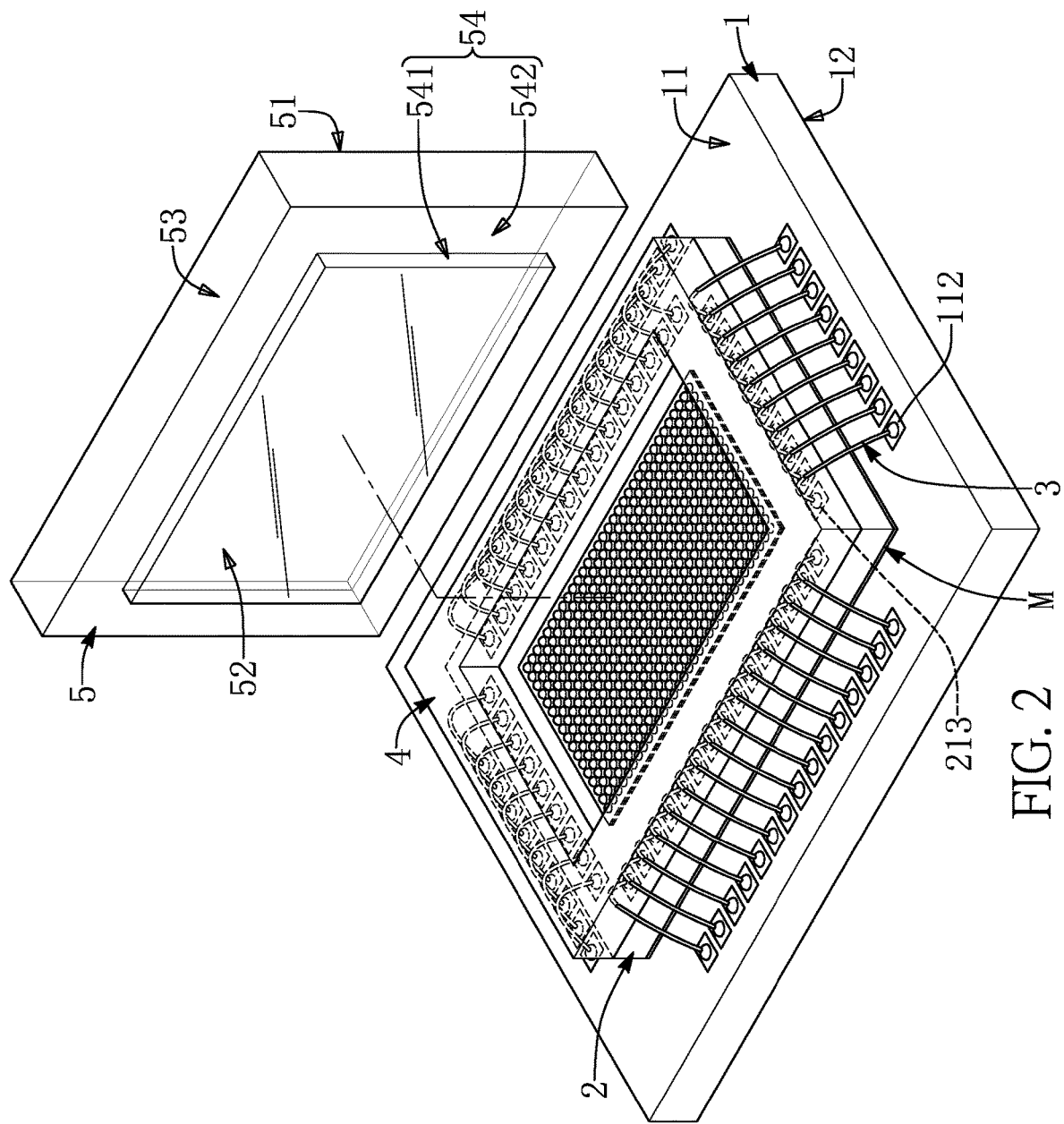
FIG. 2 is an exploded view of FIG. 1 when a package body is omitted.

Referring to FIG. 1 to FIG. 4, a first embodiment of the present disclosure is provided. As shown in FIG. 1 and FIG. 2, the present embodiment provides a sensor package structure 100. In other words, any package structure not encapsulating a sensor chip therein has a structural design different from that of the sensor package structure 100 of the present embodiment.

Figure 3:
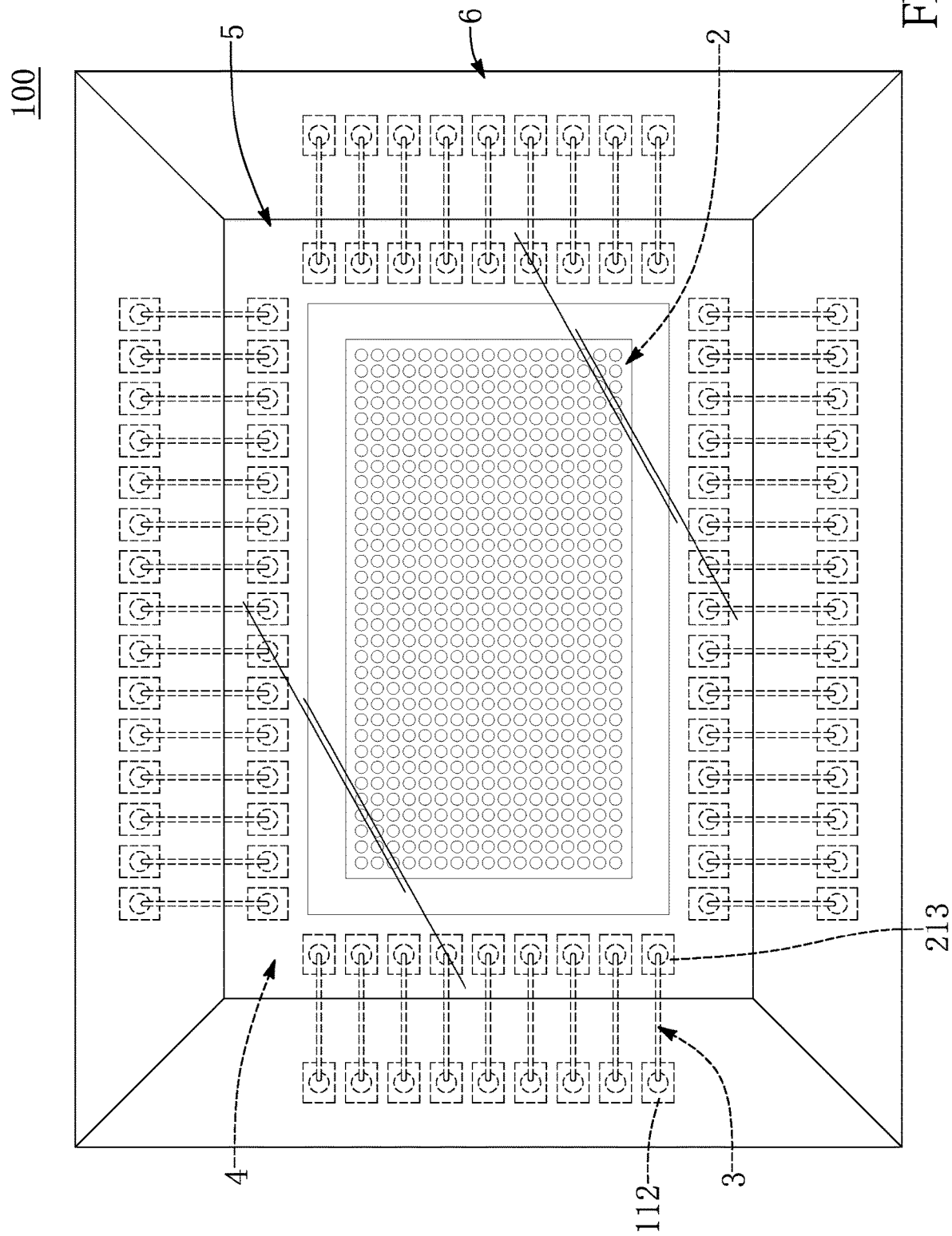
FIG. 3 is a top view of FIG. 1.
Figure 4:
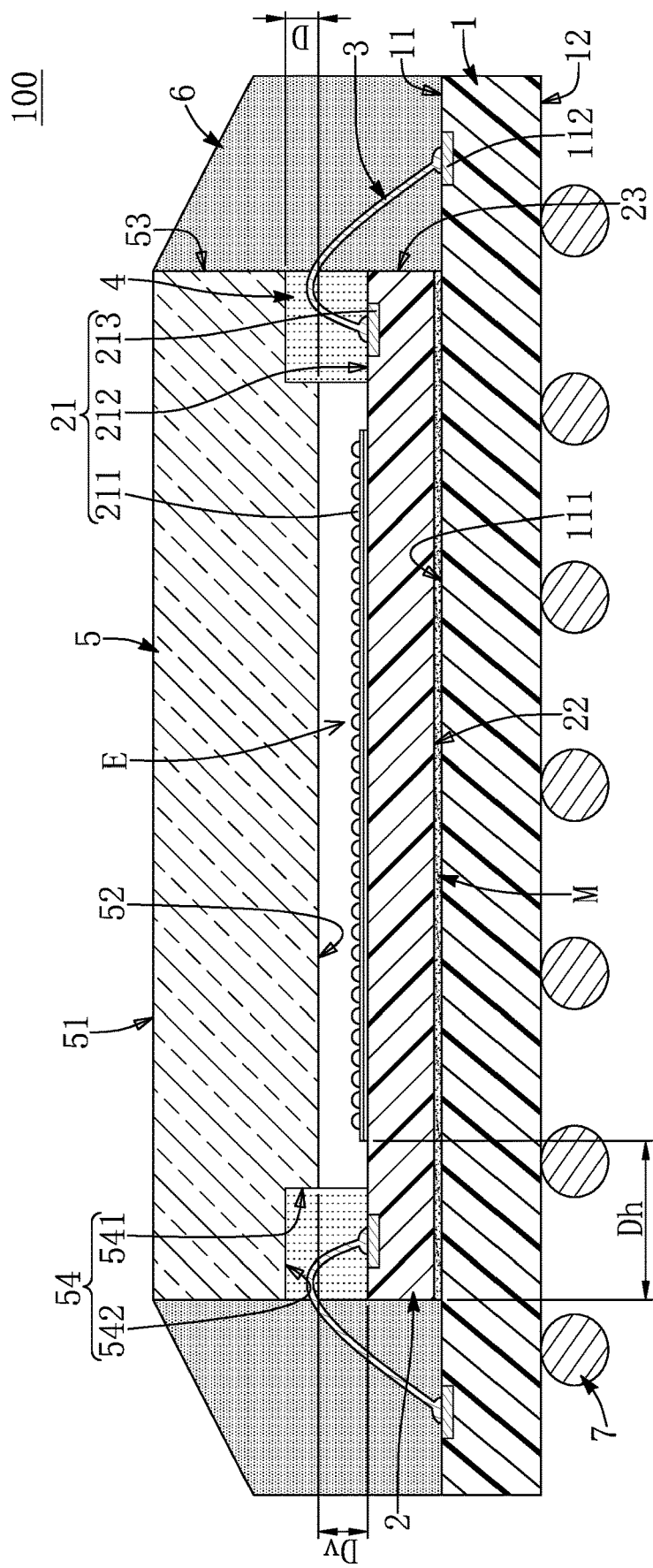
FIG. 4 is a cross-sectional view taken along line IV-IV of FIG. 1.

As shown in FIG. 2 to FIG. 4, the sensor package structure 100 includes a substrate 1, a sensor chip 2 disposed on and electrically coupled to the substrate 1, a plurality of metal wires 3 electrically coupled to the sensor chip 2 and the substrate 1, a ring-shaped supporting layer 4 disposed on the sensor chip 2, a light-permeable sheet 5 disposed on the ring-shaped supporting layer 4, and a package body 6 that is formed on the substrate 1.

The sensor package structure 100 in the present embodiment includes the above components, but can be adjusted or changed according to design requirements. For example, in other embodiments of the present disclosure not shown in the drawings, the sensor package structure 100 can be provided without the metal wires 3, and the sensor chip 2 is fixed onto and electrically coupled to the substrate 1 in a flip-chip manner; or, the package body 6 of the sensor package structure 100 can be omitted or can be replaced by other components. The following description describes the structure and connection relationship of each component of the sensor package structure 100.

The substrate 1 of the present embodiment is in a square-shape or a rectangular shape, but the present disclosure is not limited thereto. The substrate 1 has a first surface 11 and a second surface 12 that is opposite to the first surface 11. The first surface 11 of the substrate 1 includes a chip-bonding region 111 arranged approximately on a center portion thereof, and the substrate 1 includes a plurality of bonding pads 112 that are disposed on the first surface 11 and that are arranged outside of the chip-bonding region 111 (or the sensor chip 2). The bonding pads 112 in the present embodiment are substantially in a ring-shaped arrangement, but the present disclosure is not limited thereto. For example, in other embodiments of the present disclosure not shown in the drawings, the bonding pads 112 can be arranged in two rows respectively at two opposite sides of the chip-bonding region 111.

In addition, the substrate 1 can be further provided with a plurality of solder balls 7 disposed on the second surface 12 thereof. The sensor package structure 100 can be soldered onto an electronic component (not shown in the drawings) through the solder balls 7, thereby electrically connecting the sensor package structure 100 to the electronic component.

The sensor chip 2 in the present embodiment is an image sensing chip, but the present disclosure is not limited thereto. A bottom surface 22 of the sensor chip 2 is fixed onto the first surface 11 of the substrate 1 (e.g., the chip-bonding region 111), and the sensor chip 2 is arranged to be surrounded on the inside of the bonding pads 112. It should be noted that the sensor package structure 100 in the present embodiment includes an adhesive M (e.g., a thermally conductive adhesive) disposed on the chip-bonding region 111, and the sensor chip 2 is fixed onto the chip-bonding region 111 through the adhesive M (e.g., the bottom surface 22 of the sensor chip 2 is adhered to the chip-bonding region 111 through the adhesive M), but the present disclosure is not limited thereto. For example, in other embodiments of the present disclosure not shown in the drawings, the adhesive M can be omitted or can be replaced by other components.

Moreover, a top surface 21 of the sensor chip 2 has a sensing region 211 and a carrying region 212 that has a ring-shape arranged around the sensing region 211. In addition, the sensor package structure 100 of the present embodiment can be provided to encapsulate the sensor chip 2 having a smaller size through the overall structural design thereof (e.g., a transverse distance Dh between the sensing region 211 and a lateral surface 23 of the sensor chip 2 is less than 1 mm), but the present disclosure is not limited thereto.

Specifically, the sensor chip 2 in the present embodiment includes a plurality of connection pads 213 arranged on the carrying region 212. The number and positions of the connection pads 213 of the sensor chip 2 in the present embodiment correspond to those of the bonding pads 112 of the substrate 1. In other words, the connection pads 213 are substantially in a ring-shaped arrangement, and a quantity of the connection pads 213 is equal to that of the bonding pads 112.

Each of the metal wires 3 has a first end and a second end, the first ends of the metal wires 3 are respectively connected to the bonding pads 112, and the second ends of the metal wires 3 are respectively connected to the connection pads 213, so that the substrate 1 and the sensor chip 2 can be electrically coupled to each other through the metal wires 3. Furthermore, any one of the metal wires 3 can be in a normal bond manner or a reverse bond manner according to design requirement, and the present disclosure is not limited thereto.

The ring-shaped supporting layer 4 in the present embodiment is an opaque layer, and the ring-shaped supporting layer 4 is disposed on the carrying region 212 of the sensor chip 2 and surrounds the sensing region 211. In other words, the connection pads 213 are embedded in the ring-shaped supporting layer 4, and the second ends of the metal wires 3 respectively connected to the connection pads 213 are embedded in the ring-shaped supporting layer 4.

The light-permeable sheet 5 in the present embodiment is a transparent and flat glass board, but the present disclosure is not limited thereto. The light-permeable sheet 5 in the present embodiment has an outer surface 51, an inner surface 52 that is opposite to the outer surface 51, a surrounding lateral surface 53 connected to the outer surface 51, and a ring-shaped notch 54 that is recessed in a peripheral edge of the inner surface 52 and a bottom edge of the surrounding lateral surface 53.

Moreover, a depth D of the ring-shaped notch 54 with respect to the inner surface 52 is at least 10 μm, and the depth D is preferably not greater than 50% of a thickness of the light-permeable sheet 5. In the present embodiment, the ring-shaped notch 54 has a riser surface 541 connected to the inner surface 52 and a tread surface 542 that connects the riser surface 541 and the surrounding lateral surface 53. The tread surface 542 is parallel to the inner surface 52 and is spaced apart from the inner surface 52 by a distance that is equal to the depth D.

The light-permeable sheet 5 is arranged above the sensor chip 2 by being disposed on the ring-shaped supporting layer 4; in other words, the ring-shaped supporting layer 4 in the present embodiment is sandwiched between the tread surface 542 of the light-permeable sheet 5 and the carrying region 212 of the sensor chip 2. Moreover, the inner surface 52 of the light-permeable sheet 5, an inner side of the ring-shaped supporting layer 4, and the top surface 21 of the sensor chip 2 jointly define an enclosed space E. The sensing region 211 is arranged in the enclosed space E and faces toward the inner surface 52 of the light-permeable sheet 5.

Specifically, the light-permeable sheet 5 in the present embodiment is limited to being disposed on the ring-shaped supporting layer 4 only through the ring-shaped notch 54, and the inner surface 52 of the light-permeable sheet 5 is not in contact with the ring-shaped supporting layer 4, thereby effectively reducing occurrence of delamination between the light-permeable sheet 5 and the ring-shaped supporting layer 4 and further reducing the occurrences of any process defects during the manufacturing of the sensor package structure 100 (such as a bleeding phenomenon during solidification of the ring-shaped supporting layer, or tilting or squashing of the light-permeable sheet).

Moreover, the ring-shaped notch 54 of the light-permeable sheet 5 is formed in structural cooperation with the ring-shaped supporting layer 4, so that a longitudinal distance Dv between the top surface 21 of the sensor chip 2 and the inner surface 52 of the light-permeable sheet 5 can be accurately controlled to be within a range from 75 µm to 200 µm, but the present disclosure is not limited thereto.

In addition, connection relationships between the light-permeable sheet 5 and other components preferably satisfy the following structural features, thereby facilitating the sensor package structure 100 to encapsulate the sensor chip 2 having a smaller size. Specifically, the connection pads 213 are located directly under the tread surface 542 of the light-permeable sheet 5, a part of at least one of the metal wires 3 is arranged in the ring-shaped notch 54 and is not in contact with the ring-shaped notch 54, and the surrounding lateral surface 53 of the light-permeable sheet 5 is preferably flush or coplanar with an outer side of the ring-shaped supporting layer 4 and the lateral surface 23 of the sensor chip 2, but the present disclosure is not limited thereto.

The package body 6 in the present embodiment is formed on the first surface 11 of the substrate 1, and an edge of the package body 6 is flush with that of the substrate 1. The sensor chip 2, the ring-shaped supporting layer 4, the light-permeable sheet 5, and a part of each of the metal wires 3 are embedded in the package body 6, and at least part of the outer surface 51 of the light-permeable sheet 5 is exposed from the package body 6.

Specifically, the package body 6 in the present embodiment is formed by solidifying a liquid compound, but the present disclosure is not limited thereto. For example, in other embodiments of the present disclosure not shown in the drawings, a molding compound can be further formed on a top side of the package body 6; or, the package body 6 can be a molding compound.

Second Embodiment

Figure 5:
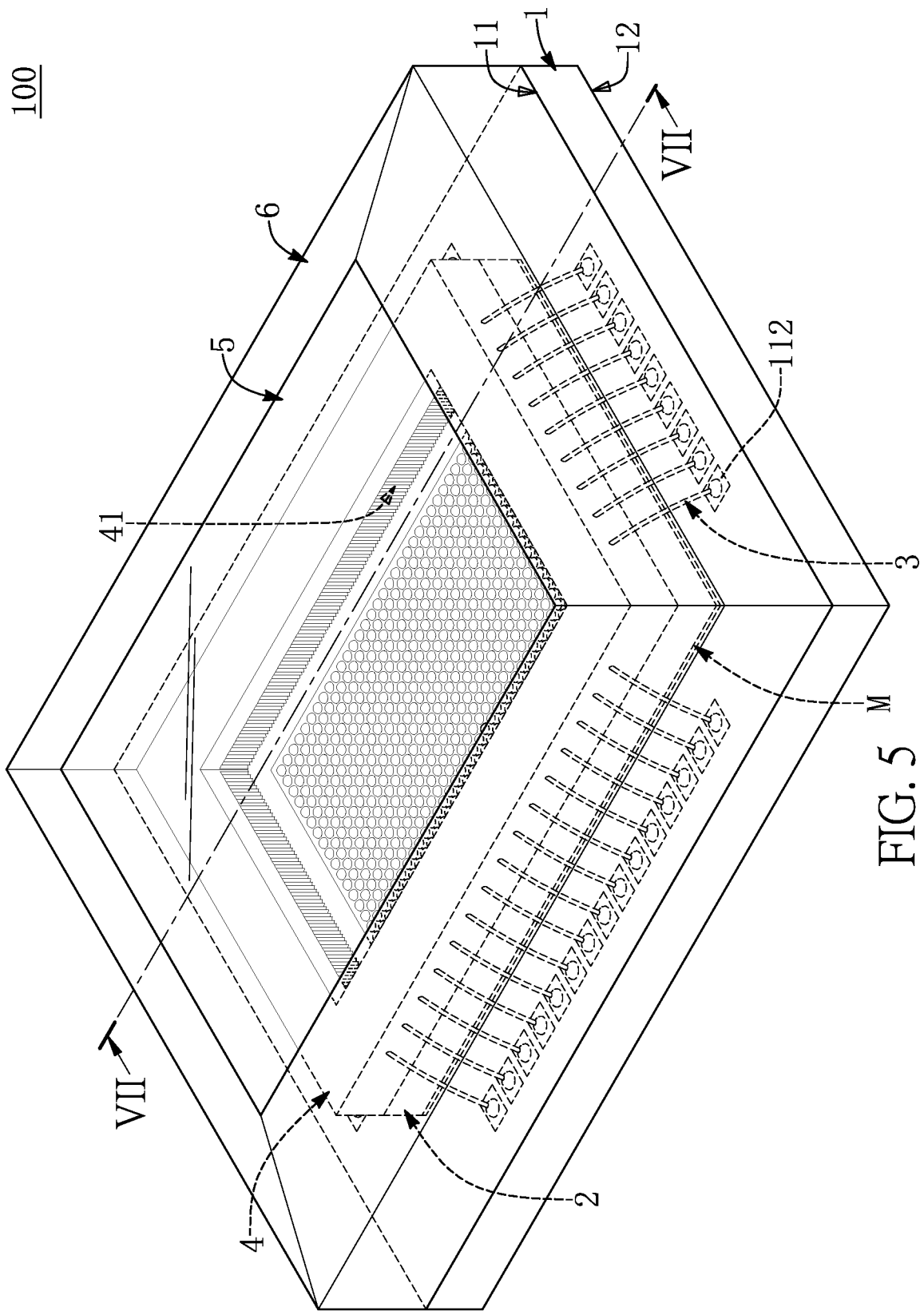
FIG. 5 is a perspective view of the sensor package structure according to a second embodiment of the present disclosure.
Figure 6:
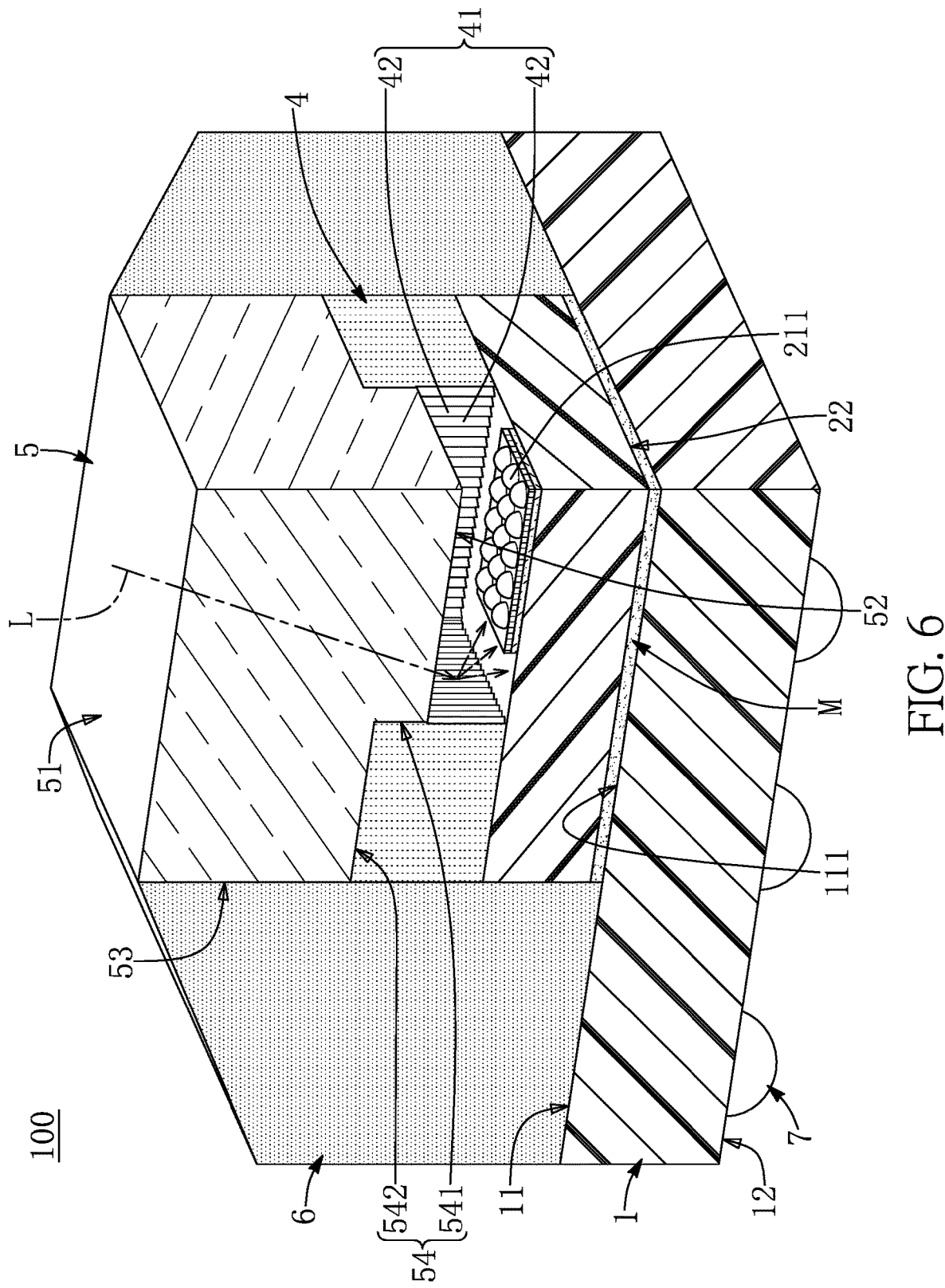
FIG. 6 is a perspective cross-sectional view of the sensor package structure according to the second embodiment of the present disclosure.
Figure 7:
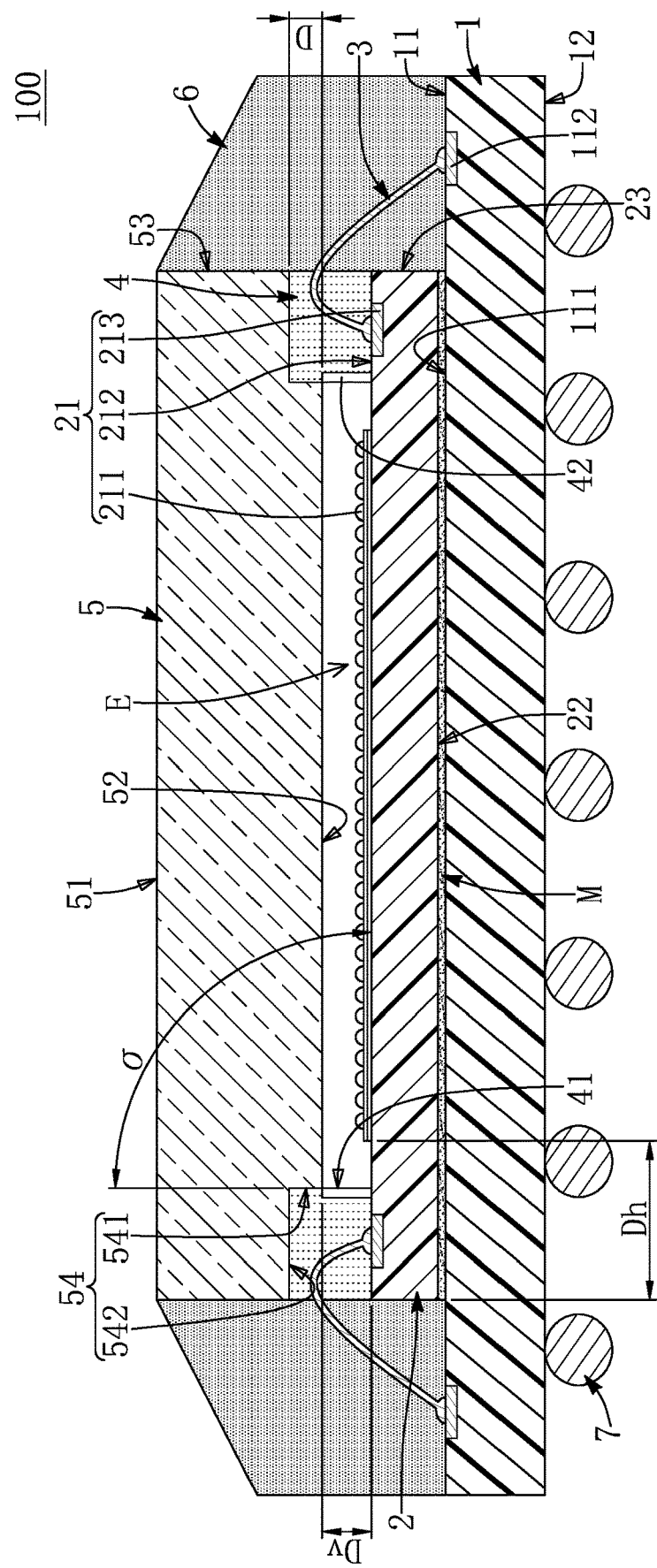
FIG. 7 is a cross-sectional view taken along line VII-VII of FIG. 5.

Referring to FIG. 5 to FIG. 7, a second embodiment of the present disclosure is provided, which is similar to the first embodiment of the present disclosure. For the sake of brevity, descriptions of the same components in the first and second embodiments of the present disclosure will be omitted herein, and the following description only discloses different features between the first and second embodiments.

In the present embodiment, the ring-shaped supporting layer 4 is a B-stage epoxy layer or a photo resist layer, and an inner side of the ring-shaped supporting layer 4 has a light-scattering surface 41 being in a ring-shaped arrangement. The light-scattering surface 41 has a plurality of jagged stripes 42 that are spaced apart from each other and that are in a ring-shaped arrangement, and any two of the jagged stripes 42 of the light-scattering surface 41 adjacent to each other in the present embodiment are arranged to be equidistantly apart, but the present disclosure is not limited thereto. For example, in other embodiments of the present disclosure not shown in the drawings, the jagged stripes 42 can be in a ring-shaped arrangement by being connected to each other or being spaced apart from each other at different intervals according to design requirements.

Moreover, the light-scattering surface 41 and the sensing region 211 have an angle σ there-between, and the angle σ in the present embodiment is 90 degrees, but the present disclosure is not limited thereto. For example, the angle σ can be within a range of from 80 degrees to 100 degrees according to design requirements. Specifically, a longitudinal direction of each of the jagged stripes 42 in the light-scattering surface 41 is preferably perpendicular to the sensing region 211 of the sensor chip 2.

Accordingly, when light L travels onto the light-scattering surface 41 at an incidence angle by passing through the light-permeable sheet 5 (as shown in FIG. 6), the light-scattering surface 41 or the jagged stripes 42 can be configured to transform the light L into a plurality of beams along different angles different from the incidence angle, thereby effectively reducing the occurrence of the glare phenomenon in the sensor package structure 100.

Beneficial Effects of the Embodiments

In conclusion, the light-permeable sheet of the sensor package structure provided by the present disclosure is limited to being disposed on the ring-shaped supporting layer only through the ring-shaped notch, thereby effectively reducing occurrence of delamination between the light-permeable sheet and the ring-shaped supporting layer and further reducing the occurrences of any process defects during the manufacturing of the sensor package structure (such as a bleeding phenomenon during solidification of the ring-shaped supporting layer, or tilting or squashing of the light-permeable sheet).

Moreover, the sensor package structure of the present disclosure is provided with the light-scattering surface formed on the inner lateral side of the ring-shaped supporting layer, so that the light traveling onto the light-scattering surface by passing through the light-permeable layer can be transformed into a plurality of beams along different angles different from the incidence angle, thereby effectively reducing the occurrence of the glare phenomenon in the sensor package structure.

Specifically, when the ring-shaped supporting layer of the present disclosure is implemented by the UV curable epoxy, the B-stage epoxy layer, or the photo resist layer, since the UV curable epoxy, the B-stage epoxy layer, or the photo resist layer can be formed by punching, lithography, printing, or coating, the thickness of the ring-shaped supporting layer can be effectively and precisely controlled, and the shape of the ring-shaped supporting layer (e.g., the shape of the light-scattering surface) can be precisely formed. Accordingly, the sensor package structure of the present disclosure can be formed to reduce the occurrence of the glare phenomenon therein.

Moreover, the light-scattering surface of the ring-shaped supporting layer of the sensor package structure provided by the present disclosure can be formed with a specific structure (e.g., the longitudinal direction of each of the jagged stripes of the light-scattering surface is perpendicular to the sensing region of the sensor chip; or any two of the jagged stripes of the light-scattering surface adjacent to each other are arranged to be equidistantly apart), so that the sensor package structure can be formed to further reduce the occurrence of the glare phenomenon therein.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
   a substrate having a first surface and a second surface that is opposite to the first surface;
   a sensor chip disposed on the first surface of the substrate and electrically coupled to the substrate, wherein a top surface of the sensor chip has a sensing region and a carrying region that is arranged outside of the sensing region;
   a ring-shaped supporting layer disposed on the carrying region of the sensor chip and surrounding the sensing region; and
   a light-permeable sheet having an outer surface and an inner surface that is opposite to the outer surface, wherein the light-permeable sheet has a ring-shaped notch recessed in a peripheral edge of the inner surface, and a depth of the ring-shaped notch with respect to the inner surface is at least 10 µm, and wherein the light-permeable sheet is disposed on the ring-shaped supporting layer through the ring-shaped notch, and the inner surface of the light-permeable sheet is not in contact with the ring-shaped supporting layer, so that the inner surface of the light-permeable sheet, an inner side of the ring-shaped supporting layer, and the top surface of the sensor chip jointly define an enclosed space therein.

2. The sensor package structure according to claim 1, wherein the light-permeable sheet has a surrounding lateral surface connected to the outer surface, and the ring-shaped notch has a riser surface connected to the inner surface and a tread surface that connects the riser surface and the surrounding lateral surface, and wherein the tread surface is parallel to the inner surface and is spaced apart from the inner surface by a distance that is equal to the depth.

3. The sensor package structure according to claim 2, wherein the substrate includes a plurality of bonding pads arranged outside of the sensor chip, and the sensor chip includes a plurality of connection pads arranged on the carrying region, wherein the connection pads are located directly under the tread surface and are embedded in the ring-shaped supporting layer, and the sensor package structure includes a plurality of metal wires each having a first end and a second end, and wherein the first ends of the metal wires are respectively connected to the bonding pads, and the second ends of the metal wires are respectively connected to the connection pads and are embedded in the ring-shaped supporting layer.

4. The sensor package structure according to claim 3, wherein a part of at least one of the metal wires is arranged in the ring-shaped notch and is not in contact with the ring-shaped notch.

5. The sensor package structure according to claim 1, wherein a transverse distance between the sensing region and a lateral surface of the sensor chip is less than 1 mm, and a longitudinal distance between the top surface of the sensor chip and the inner surface of the light-permeable sheet is within a range from 75 µm to 200 µm.

6. The sensor package structure according to claim 5, wherein an outer side of the ring-shaped supporting layer is flush with the lateral surface of the sensor chip and a surrounding lateral surface of the light-permeable sheet.

7. The sensor package structure according to claim 1, wherein the ring-shaped supporting layer is a UV curable epoxy, a B-stage epoxy layer, a photo resist layer, or an opaque layer.

8. The sensor package structure according to claim 1, wherein the inner side of the ring-shaped supporting layer has a light-scattering surface in a ring-shaped arrangement, and wherein, when light travels onto the light-scattering surface at an incidence angle by passing through the light-permeable sheet, the light-scattering surface is configured to transform the light into a plurality of beams along different angles different from the incidence angle.

9. The sensor package structure according to claim 8, wherein the light-scattering surface has a plurality of jagged stripes spaced apart from each other, and a longitudinal direction of each of the jagged stripes is perpendicular to the sensing region.

10. The sensor package structure according to claim 1, further comprising a package body formed on the first surface, wherein the sensor chip, the ring-shaped supporting layer, and the light-permeable sheet are embedded in the package body, and at least part of the outer surface of the light-permeable sheet is exposed from the package body.

* * * * *